US008477529B2

(12) United States Patent
Keshtbod et al.

(10) Patent No.: US 8,477,529 B2
(45) Date of Patent: Jul. 2, 2013

(54) EMBEDDED MAGNETIC RANDOM ACCESS MEMORY (MRAM)

(71) Applicants: Parviz Keshtbod, Los Altos Hills, CA (US); Ebrahim Abedifard, Sunnyvale, CA (US)

(72) Inventors: Parviz Keshtbod, Los Altos Hills, CA (US); Ebrahim Abedifard, Sunnyvale, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/623,054

(22) Filed: Sep. 19, 2012

(65) Prior Publication Data

US 2013/0017627 A1 Jan. 17, 2013

Related U.S. Application Data

(60) Division of application No. 12/778,725, filed on May 12, 2010, now Pat. No. 8,289,757, which is a continuation-in-part of application No. 11/776,692, filed on Jul. 12, 2007, now Pat. No. 8,063,459.

(60) Provisional application No. 61/177,641, filed on May 12, 2009.

(51) Int. Cl.
   *G11C 11/00* (2006.01)

(52) U.S. Cl.
   USPC ........... 365/158; 365/148; 365/171; 365/172; 977/935

(58) Field of Classification Search
   USPC ................. 365/48, 55, 62, 66, 74, 78, 80–93, 365/100, 130, 131, 148, 158, 171–173, 209, 365/213, 225.5, 230.07, 232, 243.5; 216/22; 257/295, 421, E21.665; 438/3; 428/810–816, 428/817–825.1, 826; 977/933–935
   See application file for complete search history.

(56) References Cited

U.S. PATENT DOCUMENTS

2005/0277207 A1* 12/2005 Costrini et al. ................... 438/3
2005/0280040 A1* 12/2005 Kasko et al. .................. 257/213

* cited by examiner

*Primary Examiner* — Harry W Byrne
(74) *Attorney, Agent, or Firm* — Maryam Imam; IPxLAW Group LLP

(57) ABSTRACT

A magnetic random access memory (MRAM) cell includes an embedded MRAM and an access transistor. The embedded MRAM is formed on a number of metal-interposed-in-interlayer dielectric (ILD) layers, which each include metal dispersed therethrough and are formed on top of the access transistor. An magneto tunnel junction (MTJ) is formed on top of a metal formed in the ILD layers that is in close proximity to a bit line. An MTJ mask is used to pattern the MTJ and is etched to expose the MTJ. Ultimately, metal is formed on top of the bit line and extended to contact the MTJ.

9 Claims, 20 Drawing Sheets

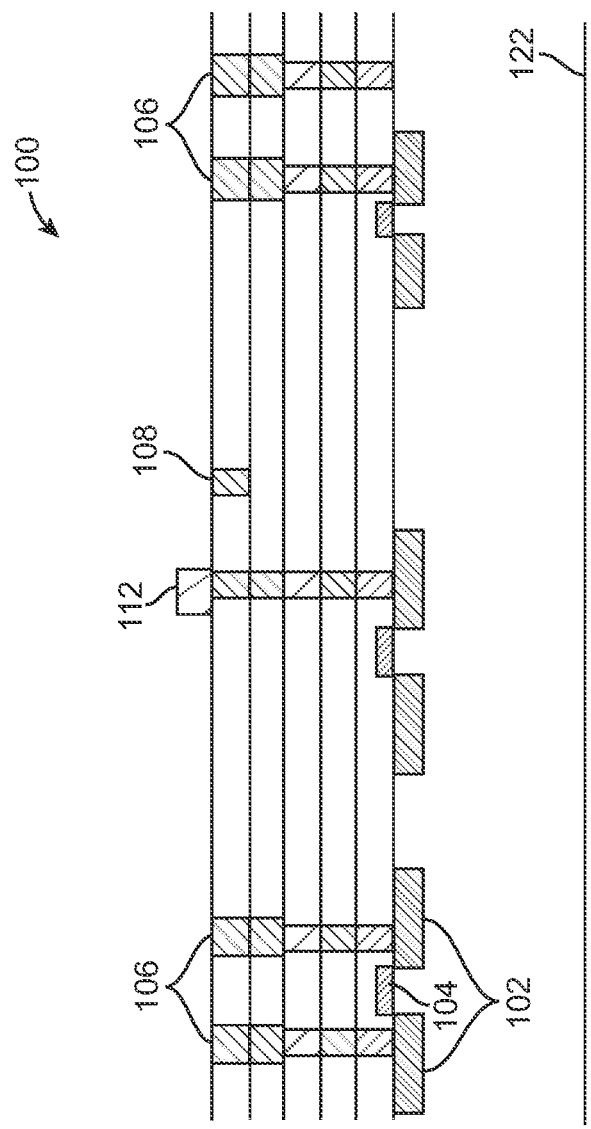

Cross Section

EMBEDDED MAGNETIC RANDOM ACCESS MEMORY (MRAM)

CROSS REFERENCE TO RELATED APPLICATIONS

This application is a divisional application of U.S. patent application Ser. No. 12/778,725, filed on May 12, 2010, by Parviz Keshtbod, et al., and entitled "EMBEDDED MAGNETIC RANDOM ACCESS MEMORY (MRAM)", which claims priority to a previously-filed U.S. Provisional Application No. 61/177,641 entitled "Embedded Magnetic Random Access Memory (MRAM)", filed on May 12, 2009 and is a continuation-in-part of U.S. patent application Ser. No. 11/776,692, entitled "Non-Volatile Magnetic Memory Element with Graded Layer", filed on Jul. 12, 2007.

BACKGROUND OF THE INVENTION

1. Field of the Invention

The present invention relates generally to non-volatile magnetic memory and particularly to embedded magnetic random access memory (MRAM).

2. Description of the Prior Art

Magnetic random access memory (MRAM) has gained much notoriety in the recent decade and is expected to ultimately replace non-magnetic memory and even though, it is non-volatile memory itself, it is further expected to replace currently-employed non-volatile memory such as flash and EEPROM. Other expected applications include replacement of disk drives.

One of the problems currently impeding the growth of MRAM is the size of MRAM cells, which are large enough to make them undesirable for many applications requiring small form factor. A typical MRAM cell includes a magnetic tunnel junction (MTJ) and an access transistor used for reading from the MTJ and writing to the MTJ. The access transistor is typically made using known non-magnetic processes, such as CMOS, and obviously, MTJs are made of processes unknown to regular circuitry process such as CMOS. The combination of the foregoing results in large memory cells. Moreover, current manufacturing techniques build the MTJ on top of all circuitry making the cell higher or taller than desired. The large number of such memory cells used in a magnetic memory array makes for larger than desired arrays that are not readily practical for use in various applications.

A number of specific applications benefiting from small MRAM cell sizes are now discussed. Most large random logic circuits, including micro processors need fast and easily accessible memory for scratch pad. This need is mostly satisfied with static RAMs. Static RAMs are volatile fast random access memories with large cell sizes. The reason for a large cell size is that they use 6 transistors per cell, with two of the p-channels, situated inside the n-well. This n-well makes the SRAM cell fairly large. In the older days, system designers used static RAM chips (or integrated circuits), which were mounted on printed boards next to the micro processors. Since the processors have experienced extraordinary growth in popularity over the past several decades and due to an increase in their size, more SRAM is needed on the circuit boards.

These days, processors function much faster and if data has to travel from SRAM to a logic circuit through the board, band width shrinks and high frequency requirements can not be met. Circuit designers prefer to replace SRAM with something smaller and faster. DRAMs and Flash memories are generally too slow. To fulfill these requirements, the logic designers place SRAM next to the logic circuit on the same semiconductor device. In this manner, they design all the memory they need on the same chip next to the random logic, and such close proximity satisfies the speed requirements. The main problems with this approach are that 1) the large size of SRAM cells makes the processor large and expensive; and 2) SRAM is volatile and all the information stored in the SRAM which controls the functions of the micro processor is lost with loss of power. To safe guard against such data loss, all the data is typically stored on Flash memory or a hard drive, and it can be loaded into the SRAM from Flash or hard disk.

What is needed is a magnetic random access memory cell including a magnetic tunnel junction and access transistor that is small in form factor.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on spin current-induced-magnetization-switching having reduced switching current in the magnetic memory.

Briefly, an embodiment and method of the present invention includes a magnetic random access memory (MRAM) cell having an embedded MRAM. The MRAM cell includes an access transistor, made from non-magnetic circuitry, and an embedded MRAM by forming a number of metal-interposed-in-interlayer dielectric (ILD) layers, which each include metal dispersed therethrough and are formed on top of the access transistor. An magneto tunnel junction (MTJ) is formed on top of a metal formed in the ILD layers that is in close proximity to a bit line. An MTJ mask is used to pattern the MTJ and is etched to expose the MTJ. Ultimately, metal is formed on top of the bit line and extended to contact the MTJ.

In another embodiment and method, a hard-to-etch metal layer is used to define a MRAM area between two sets of ILD layers in which the MTJ is built.

These and other objects and advantages of the present invention will no doubt become apparent to those skilled in the art after having read the following detailed description of the preferred embodiments illustrated in the several figures of the drawing.

IN THE DRAWINGS

FIGS. 1(a) through 1(g) show a substrate undergoing the formation of one or more MTJs and non-magnetic circuits having five metal interposed with interlayer dielectric (ILD) layers formed thereon, in accordance with a method and apparatus of the present invention.

FIGS. 2(a) through 2(k) show a substrate undergoing the formation of one or more MTJs and non-magnetic circuits having nine metal interposed with interlayer dielectric (ILD) layers formed thereon, in accordance with a method and apparatus of the present invention.

FIG. 3 shows a top view of the layout 202 of a portion of MRAM 100 where an MRAM cell comprising access transistor and MTJ is formed, in accordance with an embodiment of the present invention.

FIG. 4 shows a cross section view of the layout 202. M3, which is the bit line 21 of FIG. 2(e) is shown coupled to MTJ 60 (or 302) through metal 64.

DETAILED DESCRIPTION OF THE PREFERRED EMBODIMENTS

Figure 1A:
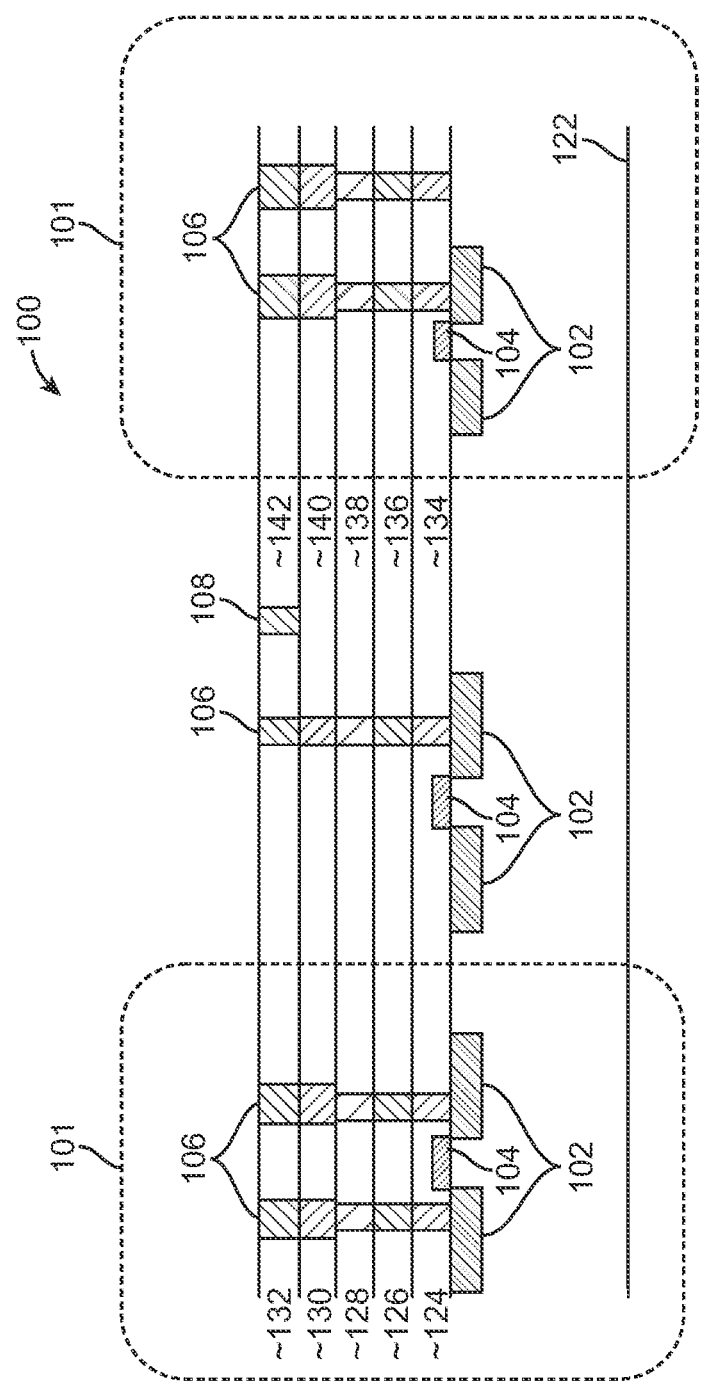

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In accordance with an embodiment and method of the present invention, magnetic memory, such as magnetic random access memory (MRAM) is embedded into non-magnetic circuits to make a die formed on a wafer of multiple layers. In one embodiment of the present invention, MRAM is built on top of all of the metal layers that are formed on top of a substrate. Specifically, an MRAM cell is formed on the top-most metal layer and a metal (or contact). Subsequently, metal is used to connect the MRAM cell to another metal that may be a bit line, for example. In this manner, there is no interlayer dielectric (ILD) deposition after MTJs are formed thereby avoiding unnecessary exposure of MRAM cells to harmful environments such as high temperatures. It is important to note that MRAM is embedded in non-memory circuitry after the non-memory circuitry is formed. The non-memory circuitry is made using processes such as but not limited to complementary metal-oxide-semiconductor (CMOS), BiCMOS, or Bipolar.

In another embodiment of the present invention, MRAM is used in addition to non-magnetic random access memory by placing a hard-to-etch metal layer over an area that is to be used for forming MRAM. In one embodiment, this hard-to-etch metal layer is made of Tantalum (Ta) or Tungsten (W) or any other metal with a lower etch rate than that of ILD. It is advantageous to place the MRAM on metal layers up to where the metal layers have the smallest design rule so that a smaller MRAM cell may be formed. The non-magnetic circuitry, which lies outside of the area preserved for MRAM, is advantageously built using the standard process used for CMOS manufacturing. Prior to formation of MRAM, interlayer dielectric (ILD) is covered by a hard-to-etch metal layer. This hard-to-etch metal layer serves as a stop layer to ensure preservation of the area to be used for MRAM. Subsequently, the stop layer is removed exposing a metal layer on top of which the MTJ is deposited. Finally, another metal, such as but not limited to tantalum (Ta) is deposited and is used to connect the top of the MTJ to a metal layer that forms the bit line. In this manner, the bit line is connected to the top of the MTJ. Forming MRAM on a metal layer closest to the substrate or farthest from the top-most metal layer advantageously allows the size of an MRAM to be smaller than that experienced by techniques that form the MRAM on the top most metal layer oftentimes occurring due to loose design rules associated with the top most metal layers.

In an exemplary embodiment, where 9 metal layers are employed, a magnetic memory cell (or MTJ) that is formed on the third metal layer from the wafer is about 6-10 times smaller than it would be if it were to be formed on the top most metal layer of the substrate. The size of the MTJ is important in that the larger the MTJ, the more real estate consumed and the higher the switching current required to switch the states of a MTJ from one magnetic state (or logic state) to another.

On the other hand, forming the MTJ on the bottom-most metal layer causes the MTJ to be exposed to undesirable non-magnetic manufacturing processes such as high temperatures. MTJ characteristics change when exposed to temperatures higher than 350 degrees Celcuis and particularly where the exposure is many times over. Such exposure would take place if the MTJ was made on top of the bottom-most metal layer and the wafers were processed to form all other metal layers. More specifically, exposure to higher temperatures would degrade the MTJ and reduce the difference between its high and low resistances as defined by a tunneling magnetic resistance (TMR) value commonly known to represent the difference between the highest resistance of that the minus the lowest resistance that the MTJ divided by the lowest resistance that the MTJ. Placing the MTJ in such early stage of the process would expose the MTJ resistor to all high temperature processing of ILD depositions between metal layers. In most cases the deposition temperatures of the ILD layers are around 450 C.

In another embodiment and method of the present invention, MRAM, which includes an MTJ, is formed on the top most metal layer.

FIGS. 1(a) through 1(g) show a substrate on top of which is formed one or more MTJs of magnetic random access memory (MRAM) and non-magnetic circuitry having five metal interposed with ILD layer formed thereon, in accordance with a method and apparatus of the present invention. As will be apparent shortly, the MTJs, each one of which along with an access transistor defines a MRAM cell, are embedded in the non-magnetic circuit. Accordingly, CMOS circuits are built in accordance with standard processes and the MRAM formation is not exposed to such processes thereby avoiding those that may be too harsh for it, such as high temperatures.

Referring now to FIG. 1(a), an embedded magnetic random access memory (MRAM) 100 is shown to include diffusion regions 102, transistor gates 104, metal-interposed-in-interlayer dielectric (ILD) layer 124, metal-interposed-in-interlayer dielectric (ILD) layer 126, metal-interposed-in-interlayer dielectric (ILD) layer 128, metal-interposed-in-interlayer dielectric (ILD) layer 130 and metal-interposed-in-interlayer dielectric (ILD) layer 132, metal (or contacts) 106, ILD 134, ILD 136, ILD 138, ILD 140, and ILD 142. MRAM 100 integrates magnetic memory and non-magnetic circuits, which may include non-magnetic memory.

The diffusion regions 102 may be N+ doped or P+ doped, as well known in the art. The diffusion regions 102 are formed on top of the silicon substrate 122. The transistor gates 104, which are also known in the art and together with the diffusion regions form a part of the non-magnetic circuitry, are formed on top of the substrate 122. The non-magnetic circuitry 101 is shown on either side of an area where magnetic memory is to be formed. Metal 108 is a bit line that is eventually connected to a MTJ.

Layers 134, 136, 138, 140 and 142 are each made using the well known double damascene process where metal is deposited over and into separations between the ILD and chemically-mechanically polished (CMPs) to form the layer with ILD separated by metal. For example, layer 134 has metal 106 dispersed throughout. Similarly, layer 136 is separated by metal 106 throughout as are each of the layers 138, 140 and 142. Layer 134 and the metal 106 collectively comprise metal interposed with ILD layer 124 and the layer 136 and metal 106 collectively comprise metal interposed with ILD layer 126 and so on through layer 142.

It is understood that the figures included and discussed herein are not drawn to scale. For example, metal 106 may be larger in width than that which appears in the figures.

Figure 1B:
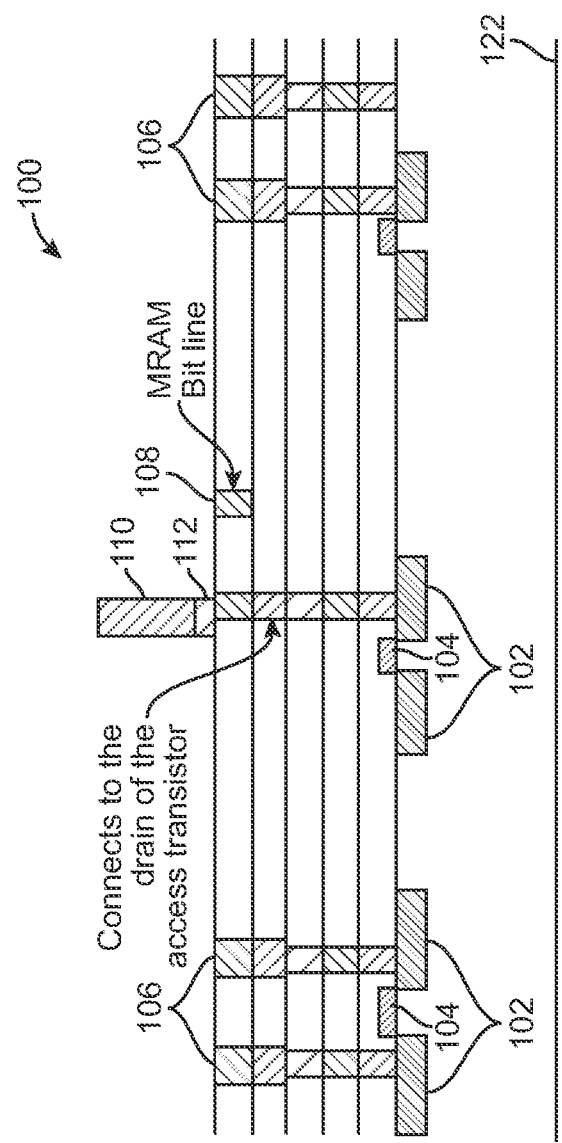

At a subsequent processing step of MRAM 100, shown in FIG. 1(b), a MTJ 112 is then formed on top of one of one of the metals 106 that is located within close proximity of bit line 108. This metal (106) is the drain of an access transistor coupled to the MTJ 112 upon formation of the MTJ 112. It is noted that the MTJ 112 is shown to not be necessarily aligned with and rather offset from the metal 106 that is directly beneath it to emphasize the point that such an alignment is advantageously unnecessarily although it is certainly contemplated. The alignment of an MTJ relative to the metal is a challenge presented in current manufacturing designs. In the various embodiments of the present invention, such an alignment is unnecessary such that the MTJ 112 is not necessarily entirely formed on top of the metal 106. The formation of the MTJ 112 on top of the metal 106 merely requires that the MTJ contact the metal 106 enough to allow sufficient current to flow through the MTJ 112. The diffusion regions 102 shown in FIG. 1(b) to be formed under and the left of the MTJ 112 and the transistor gate 104 shown formed there between collectively form an access transistor. It is understood that bit line 108 is coupled to a transistor on the substrate 122.

Next, as shown in FIG. 1(b), an MTJ mask 110 is formed on top of MTJ 112 to pattern the MTJ 112. The MTJ mask 110 is made of photoresist in one embodiment of the present invention and in another embodiment, it is made of hard mask. Next, in FIG. 1(c), the photoresist of the MTJ mask 110 is removed by a process of oxygen ashing (using oxygen plasma), well known in the art. Upon removal of the MTJ mask 110, the MTJ 112 is exposed. The purpose of the MTJ mask 110 is to protect the MTJ 112 from being etched when the surface of the wafer onto which the MRAM cell is formed is etched.

Figure 1D:
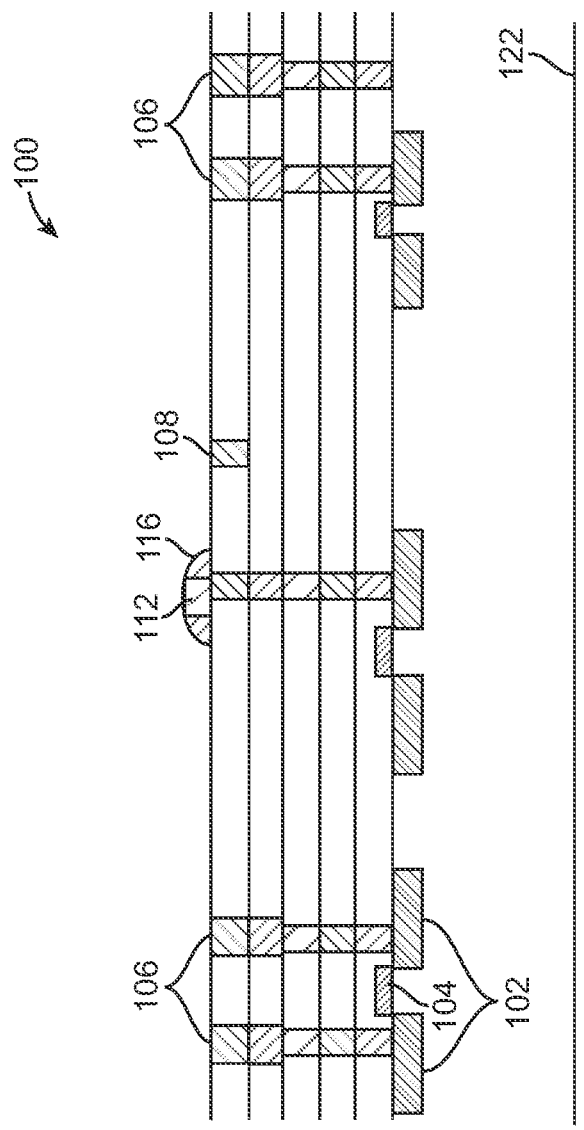

Next, as shown in FIG. 1(d), spacer 116 is formed on top and around MTJ 112 by depositing spacer 116 onto the wafer that includes substrate 122 with the MRAM being formed on top thereof. In one embodiment of the present invention, the spacer 116 is formed by depositing silicon nitride ($Si_3N_4$) on top of surface of substrate 122 or on top of all layers formed on top of the substrate 122 up until this point, as discussed above, and then etching to form the spacer 116. In another embodiment, spacer 116 is made in the same manner using oxide instead of silicon nitride.

In one embodiment, the deposited spacer 116 (either silicon nitride or oxide or any other suitable material) is approximately 1,500 Angstroms in thickness. Next, blanket etching is performed on the silicon nitride and the remainder of the surface of the substrate to form a nitride spacer all around and top of the MTJ 112.

Figure 1E:
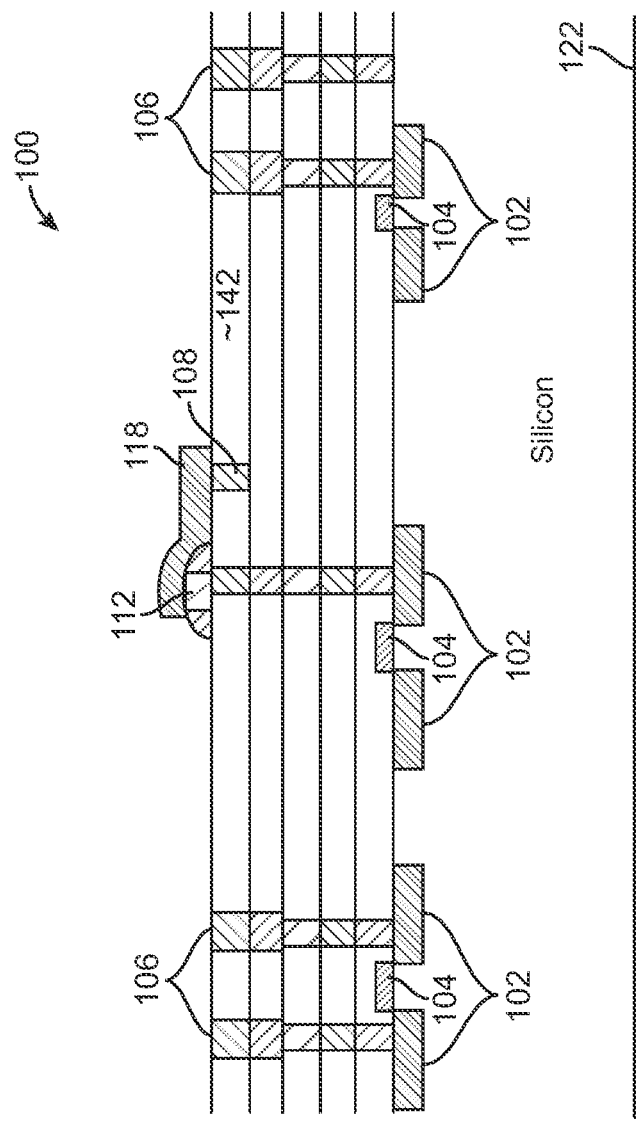
Figure 1F:
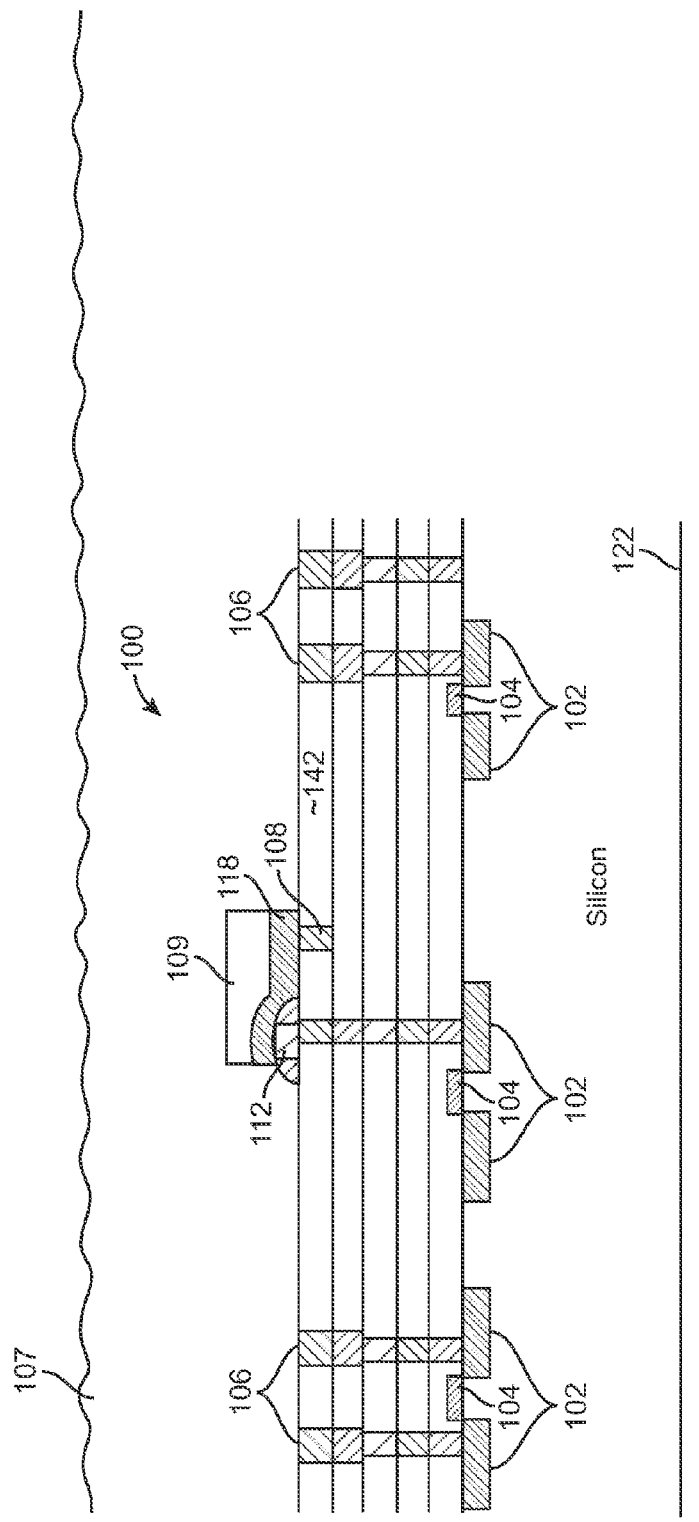
Figure 1G:
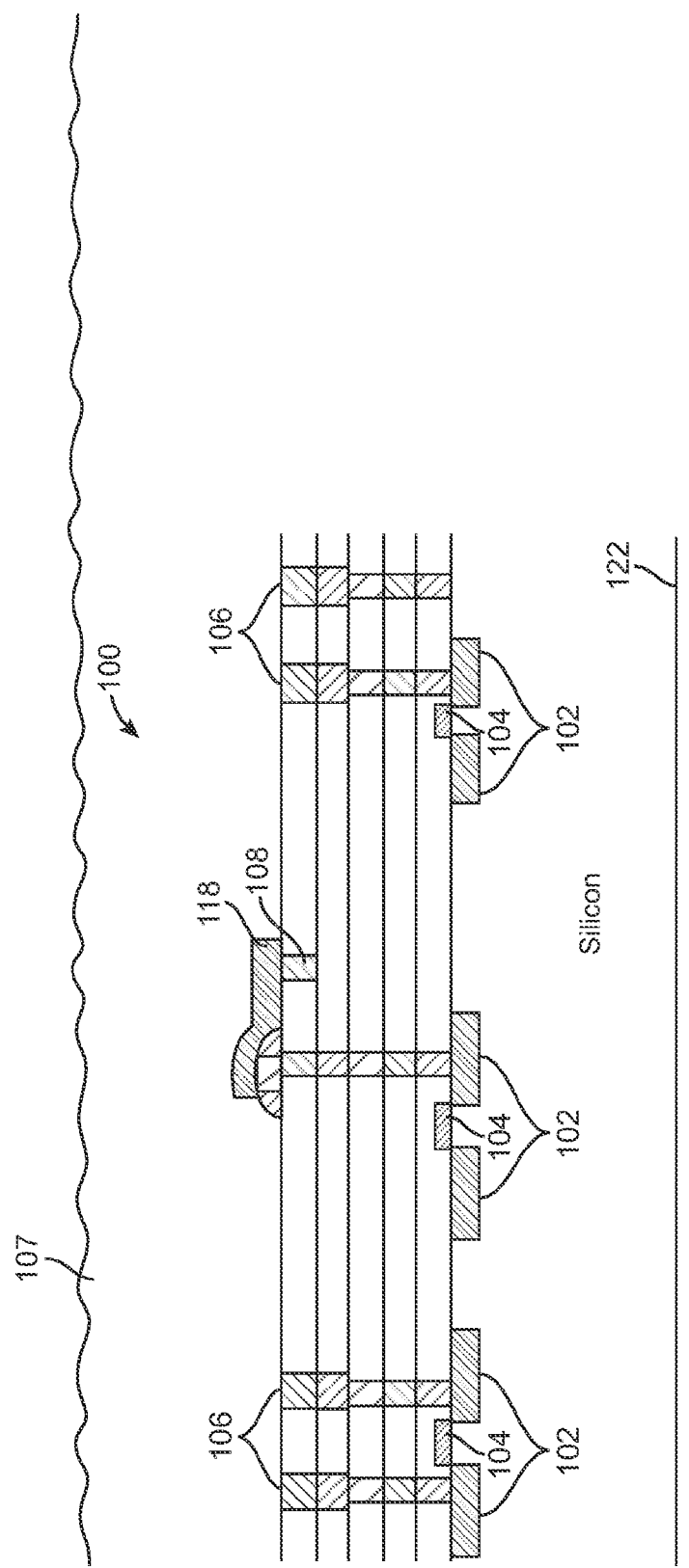

Next, at the step in FIG. 1(e), metal 118 is deposited on top of the bit line 108 and a portion of the top of the layer 142 extending through the entire top of the MTJ 112 thereby connecting the bit line 108 to the top of the MTJ 112. In one embodiment, metal 118 is made of Ta or W or any other metal that can tolerate temperatures around 350-400 degrees Celcuis. In one embodiment, metal 118 has a thickness of approximately 1,500 Angstroms. The foregoing step causes the bit line 108 to be connected to MTJ 112, which is coupled to diffusion region 102 through the metal 106. The diffusion region 102, which in one embodiment is a N+ diffusion, is the drain of the access transistor coupled to MTJ 112 whose transistor gate is 104. Next, an interconnect mask 109 is formed on top of metal 118, to define an interconnect, as shown in FIG. 1(f). The interconnect mask 109 is removed by etching it. Next, passivation layers 107 are deposited at temperatures at or below 350 degrees Celcuis. Passivation layers 107 are deposited on top of the wafer that includes substrate 122 (on top of which the MRAM cell is being formed), with the passivation layers covering the MRAM 100. The passivation layers are then masked and etched, as shown in FIG. 1(g). The purpose of the passivation layers is to protect the layers underneath from oxidation, contaminating, scratching or any other type of damage that may be experienced by the wafer. The interconnect mask 109 is typically made of photoresist and is ultimately removed by ashing. Upon the removal of the interconnect mask 109, the MTJ 112, which is embedded in the CMOS formed on the surface of the substrate 122 is exposed along with the metal 118 and bit line 108.

FIGS. 2(a) through 2(k) show a silicon substrate (included in a wafer), similar to the silicon substrate 122, undergoing the formation of one or more MTJs and CMOS circuits having nine metal interposed with ILD layers formed thereon, in accordance with a method and apparatus of the present invention.

Figure 2A:
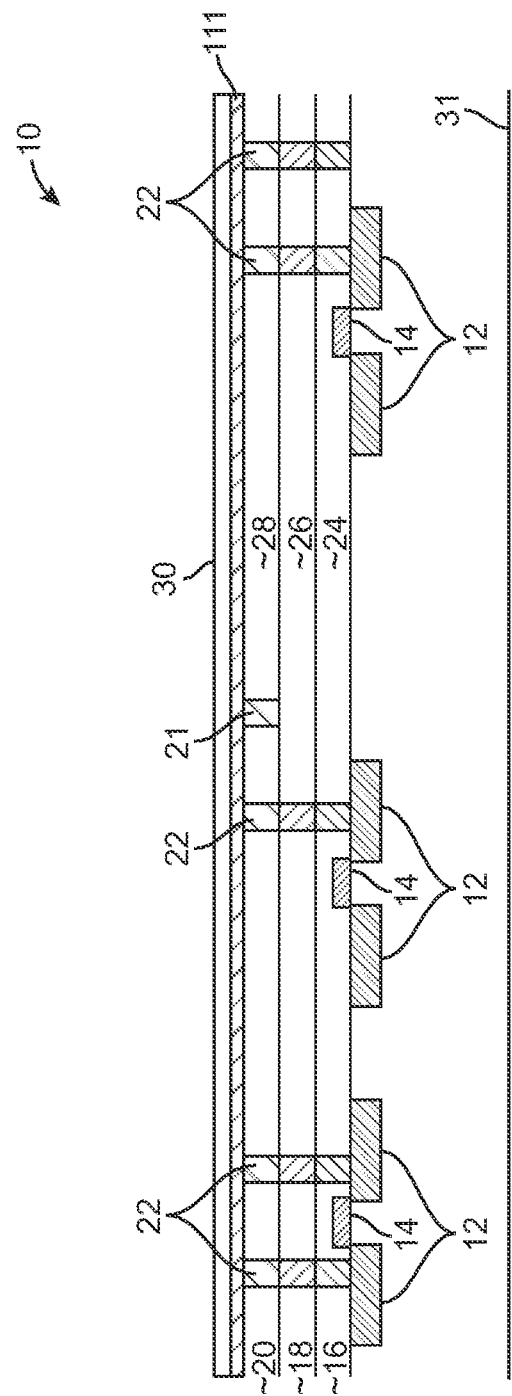
Figure 2B:
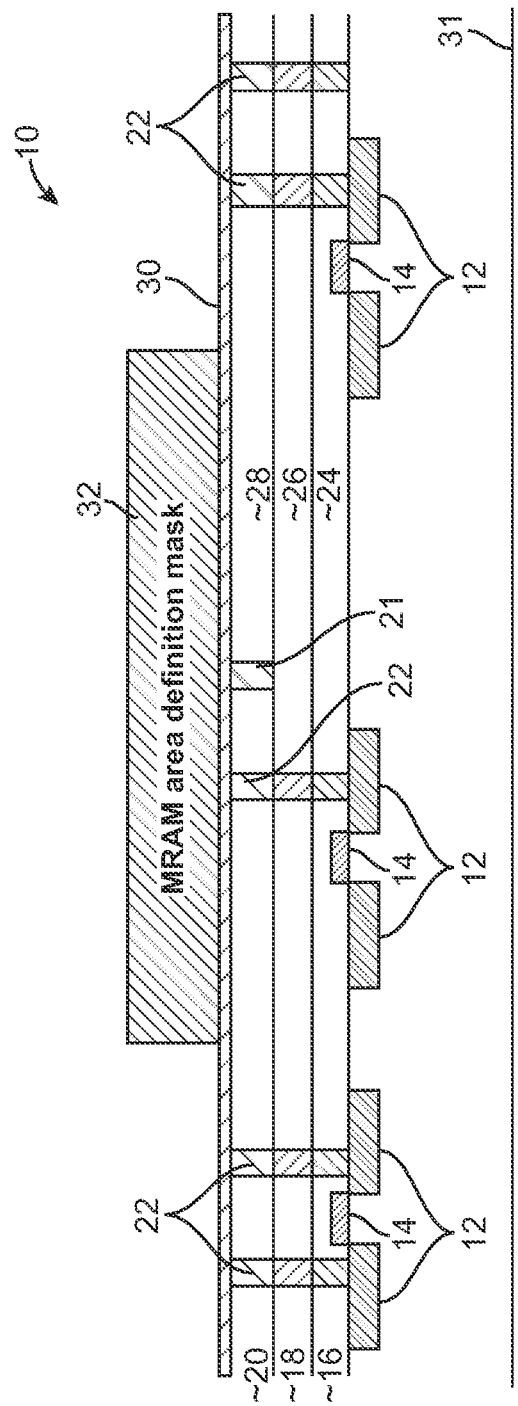
Figure 2C:
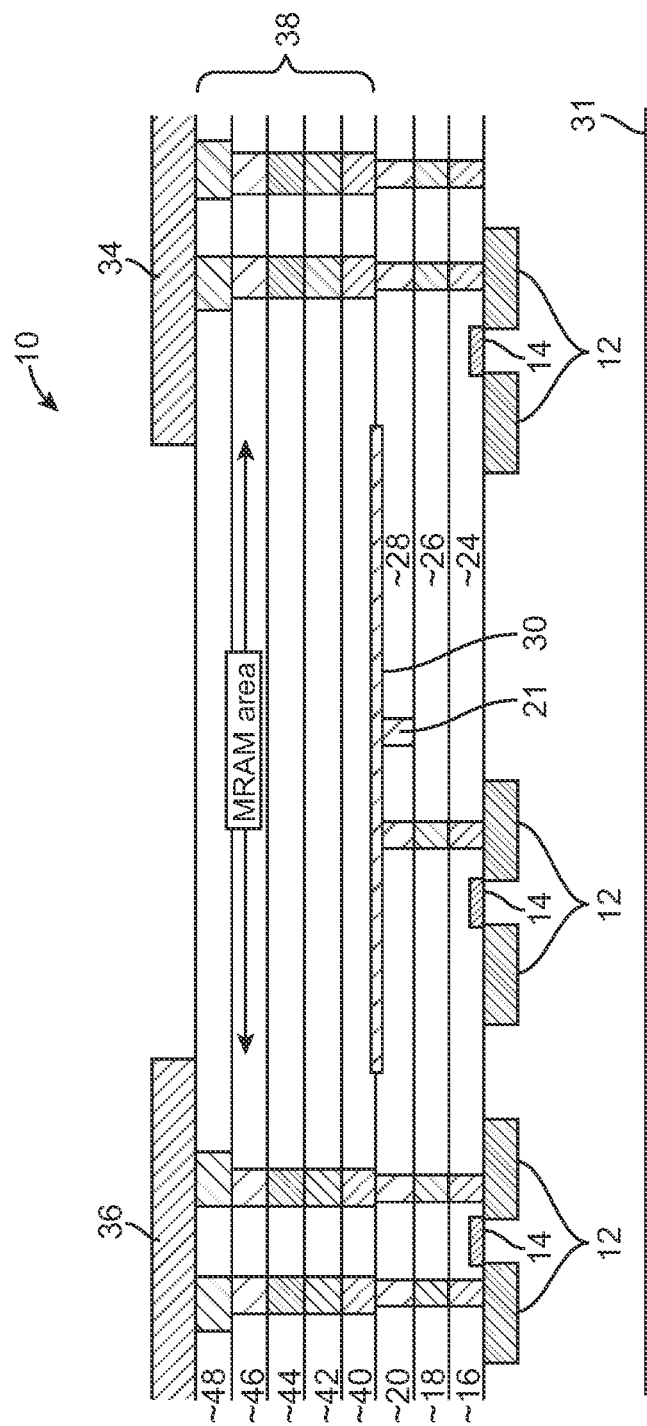
Figure 2D:
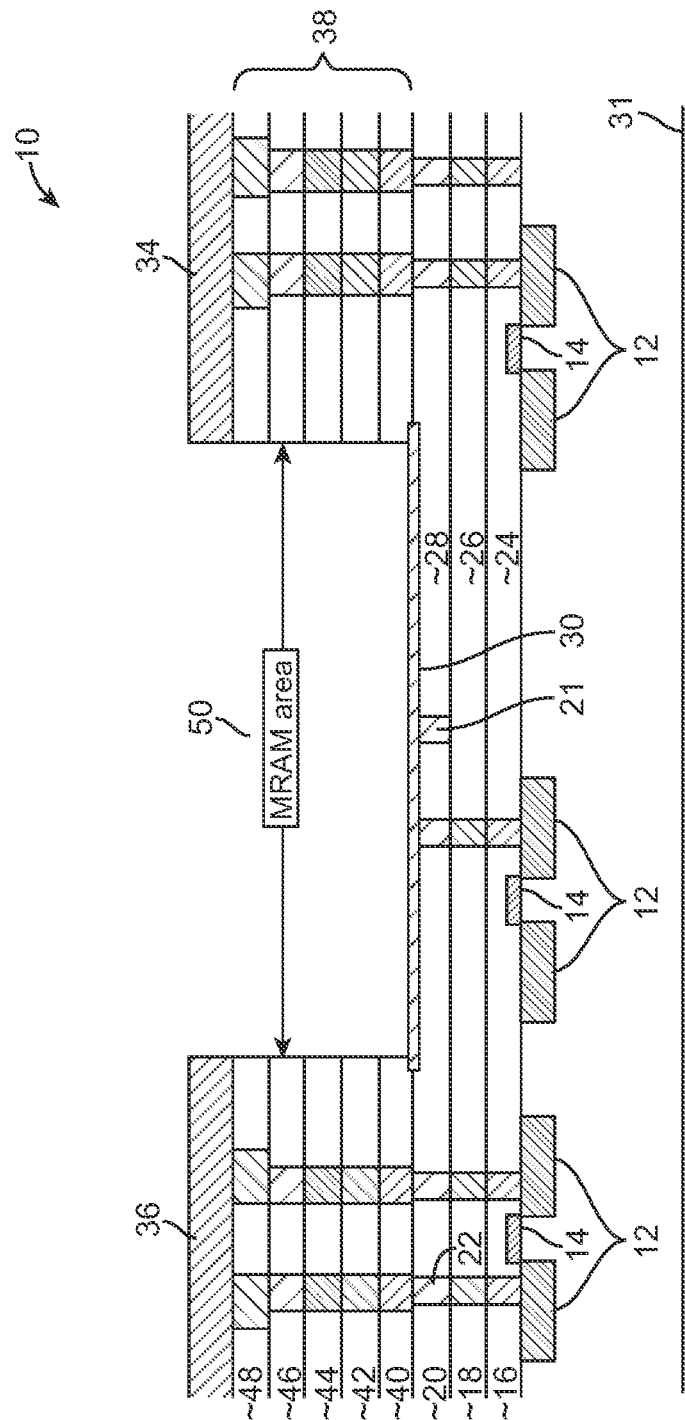

Referring now to FIG. 2(a), an embedded magnetic random access memory (MRAM) 10 is shown to include diffusion regions 12, transistor gates 14, metal interposed with interlayer dielectric (ILD) layer 16, metal interposed with ILD layer 18, metal interposed with ILD layer 20, metal (or contacts) 22 (one of which is bit line 21), ILD 24, ILD 26, ILD 28, and hard-to-etch metal layer 30. The diffusion regions 12 may be N+ doped or P+ doped, as well known in the art. The diffusion regions 12 are formed on top of the silicon substrate 31. The transistor gates 14, which are also known in the art and together with the diffusion regions form a part of the CMOS circuitry, are formed on top of the substrate 31.

It is understood that bit line 21 is coupled to a transistor on the silicon substrate 31.

Metal interposed with ILD layer 16, metal interposed with ILD layer 18 and metal interposed with ILD layer 20 are each made using the well known double damascene process where metal is deposited over and into cuts between the ILD and chemically-mechanically polished (CMPs) to the same level as the ILD. For example, ILD 24 is etched and is filled with metal 22 throughout. Similarly, ILD 26 is separated by metal 22 throughout as is ILD 28. ILD 24 and the metal 22 collectively comprise metal layer interposed with ILD 16 and the ILD 26 and metal 22 collectively comprise metal layer interposed with ILD 18 and ILD 28 and metal 22 collectively comprise metal layer interposed with ILD 20. As shown in FIG. 2(a), three layers, 16, 18, 20 are formed prior to the formation of hard-to-etch metal layer 30, which is shown formed on top of metal layer interposed with ILD 20.

In some embodiments, a nitride layer 111 is optionally deposited on top of metal interposed with ILD layer 20 and the hard-to-etch metal layer 30 is then deposited on top of the nitride layer, which acts as a cushion when the layer 30 is ultimately etched.

In some embodiments, a well known double-damascene process is used to form the layers 16, 18, 20, 40, 42, 46 and 48. Other processes are contemplated.

It is understood that the figures included and discussed herein are not drawn to scale. For example, metal 22 may be larger in width than that which appears in the figures.

In one embodiment, hard-to-etch metal layer 30 is made of Tantalum (Ta) or Tungsten (W). In other embodiments, hard-to-etch metal layer 30 is made of any metal having an etch rate, during ILD etching, that is about 5×-8× lower than the rate of etching of the ILD. In one embodiment, the thickness of layer 30 is about 1000 to 1,500 Angstroms.

At a subsequent processing step of MRAM 10, shown in FIG. 2(*b*), a MRAM area definition mask 32 is deposited on top of hard-to-etch metal layer 30 but only in a predetermined area where MRAM is to be formed and on top of at least two metal lines with at least one metal line having a diffusion region 12 formed there-under. In the embodiment of FIG. 2(*b*), the two metal lines are metal 22 and bit line 21. This is important because, as will be evident in subsequent figures, one of the at least two metal lines that is not formed on top of a diffusion region is used as a bit line, in FIGS. 2(*a*) through 2(*g*), this is bit line 21, and the other metal 22 that is formed on top of the diffusion region is the drain of the access transistor that will be coupled to an MTJ of the embedded MRAM. The area of mask 32 essentially and approximately defines the area in which MRAM is to be formed. The process of using photo-resist mask is well known.

MRAM area definition mask 32 serves to protect an area under it for formation of MRAM while the areas on either side of it, of which the top-most layer is hard-to-etch metal layer 30, are exposed. CMOS circuitry is formed underneath of both MRAM area definition mask 32 and the exposed part of hard-to-etch metal layer 30. The hard-to-etch metal layer 30 is covered in the MRAM area by the MRAM area definition mask 32 and the rest is etched. Thus, only the MRAM area is then covered with hard-to-etch metal layer 30. The MRAM area definition mask 32 is removed by etching some time prior to the formation of the IDL layers 40-48.

As will be discussed in further detail shortly, the wafer is then processed according to known techniques until all the metals are done. Then, a reverse of the mask 32 is used to etch all the ILDs on top of the remaining hard-to-etch metal layer 30. Next, the foregoing remaining hard-to-etch metal layer 30 is etched the MTJ is deposited and formed. Spacer formation, as discussed and shown relative to FIGS. 1(*a*)-1(*g*) above, follows and then the top of the MTJ is connected to the bit line via a tungsten (W) or tantalum (Ta) strap.

From the process of FIG. 2(*b*), the process then proceeds to forming the remaining circuitry 38 around the hard-to-etch metal layer 30, as shown in FIG. 2(*c*). Additional metal layer interposed with ILDs (ILD layers 40-48), forming a part of remaining circuitry 38 are formed on top of metal layer interposed with ILD 20. The ILD layer 40 is formed on top of the ILD layer 20 as well as on top of the hard-to-etch metal layer 30 in the area on top of the ILD layer 20 where the hard-to-etch metal layer 30 exists. In the embodiment of FIG. 2(*c*), nine layers of metal layer interposed with ILD are shown formed, however, in other embodiments, one or more number of metal layer interposed with ILD layers may be employed.

The last or top-most metal layer interposed with ILD to be formed, in the embodiment of FIG. 2(*c*) is metal layer interposed with ILD layer 48. The metal layer interposed with ILD between metal layer interposed with ILD layer 20 and metal layer interposed with ILD layer 48 are metal layer interposed with ILD layers 40, 42, 44, 46 and 48. On top of metal layer interposed with ILD layer 20 is formed metal layer interposed with ILD layer 40 and on top of metal layer interposed with ILD layer 40 is formed metal layer interposed with ILD layer 42. On top of metal layer interposed with ILD layer 42 is formed metal layer interposed with ILD layer 44 and on top of metal layer interposed with ILD 44 is formed metal layer interposed with ILD layer 46 on top of which is formed metal layer interposed with ILD layer 48. Subsequently, photoresist layer 34 is deposited on an adjacent side where an MRAM is to be formed and top of metal layer interposed with ILD layer 48 and photoresist layer 36 is formed on an opposing adjacent side where an MRAM is to be formed of metal layer interposed with ILD layer 48 and on top of metal layer interposed with ILD layer 48. The photoresist layers 36 and 34 do not span the entire top of metal layer interposed with ILD 48 and rather are substantially separated from each other by a space defined by the length of hard-to-etch metal layer 30 although they each slightly overlap with a respective end of hard-to-etch metal layer 30. The photoresist layers 34 and 36 may be collectively considered a single layer deposited on top of the ILD layer 48 except that it is not deposited on the MRAM area. It is understood that while the embodiments disclosed herein use a specific number of ILD layers, any number of such layers may be employed as suited for the particular intended application.

Photoresist layers 34 and 36 serve to protect the materials under them from being etched thereby acting as a mask leaving exposed the area on top of metal layer interposed with ILD layer 48 where no photoresist has been deposited. Next, as shown in FIG. 2(*d*), etching is performed on the surface of the wafer onto which the MRAM cell is formed to remove the hard-to-etch metal layer 30 but in the process of so doing, the photoresist layers 34 and 36 are also etched but because the thickness of each of the photoresist layers 34 and 36 is larger than the thickness of the hard-to-etch metal layer 30, a part of the photoresist layers 34 and 36 remains after etching whereas substantially all of the hard-to-etch metal layer 30 is removed after etching. In an exemplary method and embodiment, reactive ion etching (RIE) is utilized although other known techniques are contemplated.

During the etching step of FIG. 2(*d*), the materials below photoresist layers 34 and 36 remain while materials above hard-to-etch metal layer 30 are removed. Layer 30 protects and leaves in tact the material formed below it, as it protects these lower layers from being etched. Layer 30 extends, on either end thereof, to slightly overlap with each of the photoresist layers 34 and 36. These extended areas serve to avoid etching the remaining ILDs. This overlap occurs because when the layers 34 and 36 are formed, they are intentionally formed to slightly overlap or extend over a respective end of the layer 30 where each of the layers 34 and 36 is located. For example, during formation, the layer 34 is formed to slightly overlap with the layer 30 at an end of the layer 30 that is closest to the layer 34 and similarly, the layer 36 is formed to slightly overlap with the layer 30 at an end of the layer 30 that is closest to the layer 36.

The void that is left by the substantial removal of materials that were on top hard-to-etch metal layer 30 and between layers 34 and 36 is defined as MRAM area 50.

Next, an etching process is employed as shown in FIG. 2(*e*) to remove hard-to-etch metal layer 30. While this process removes most of the hard-to-etch metal layer 30, it does leave behind those parts of hard-to-etch metal layer 30 that are close to the end-sides of MRAM area 50. MTJ 60 is then formed substantially on top of one of the metals 22 that is located under the MRAM area 50, as discussed hereinabove where the MRAM area definition mask 32 was stated to essentially define the MRAM area 50. As with MTJ 112, MTJ 60 need not be directly aligned with the metal 22 and can rather be offset therefrom for ease of manufacturing.

Next, as shown in FIG. 2(*f*), spacer 62 is formed on top and around MTJ 60 by depositing spacer 62 on top of the MTJ 60. In one embodiment, spacer 62 is made of silicon nitride ($Si_3N_4$) or oxide. In one embodiment, the deposited silicon nitride is approximately 1,500 Angstroms in thickness.

Next, as shown in FIG. 2(*f*), blanket etching is performed on the spacer 62 to form a nitride spacer 113 all around the MTJ 60, as shown in FIG. 2(*g*). The shape of the spacer 113 is similar to a dome structure because of the MTJ 60.

Figure 2E:
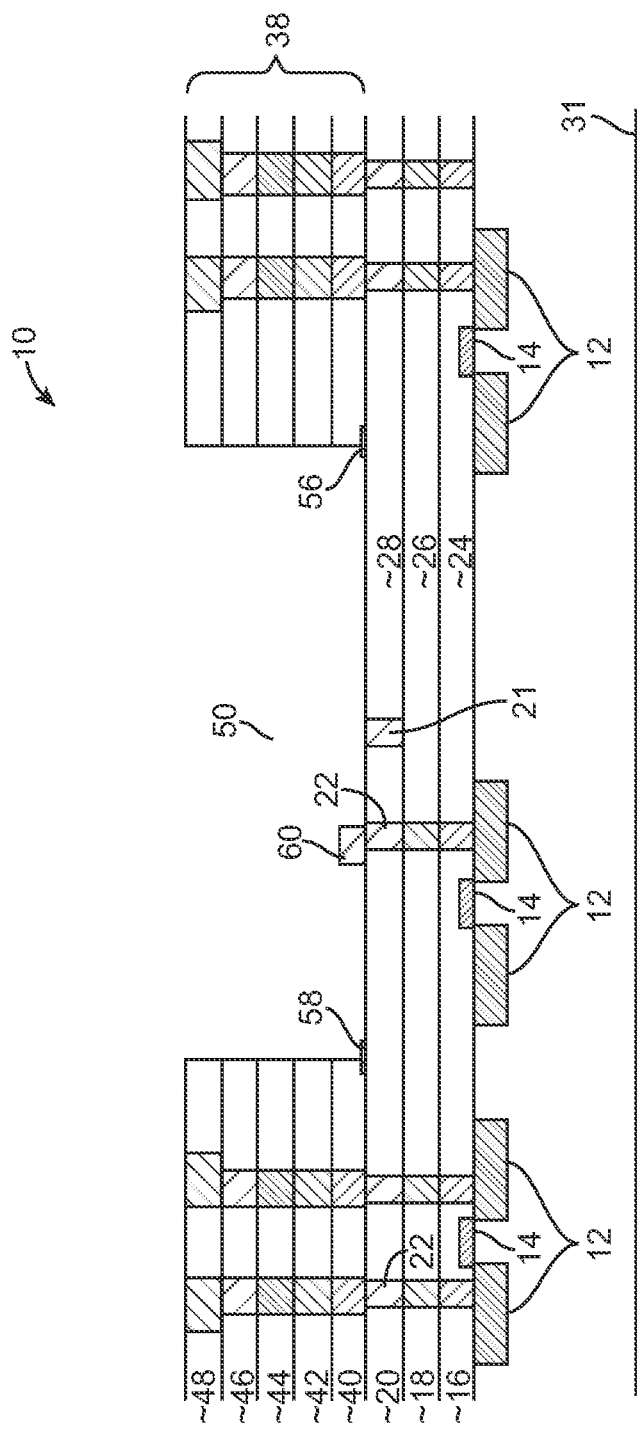
Figure 2F:
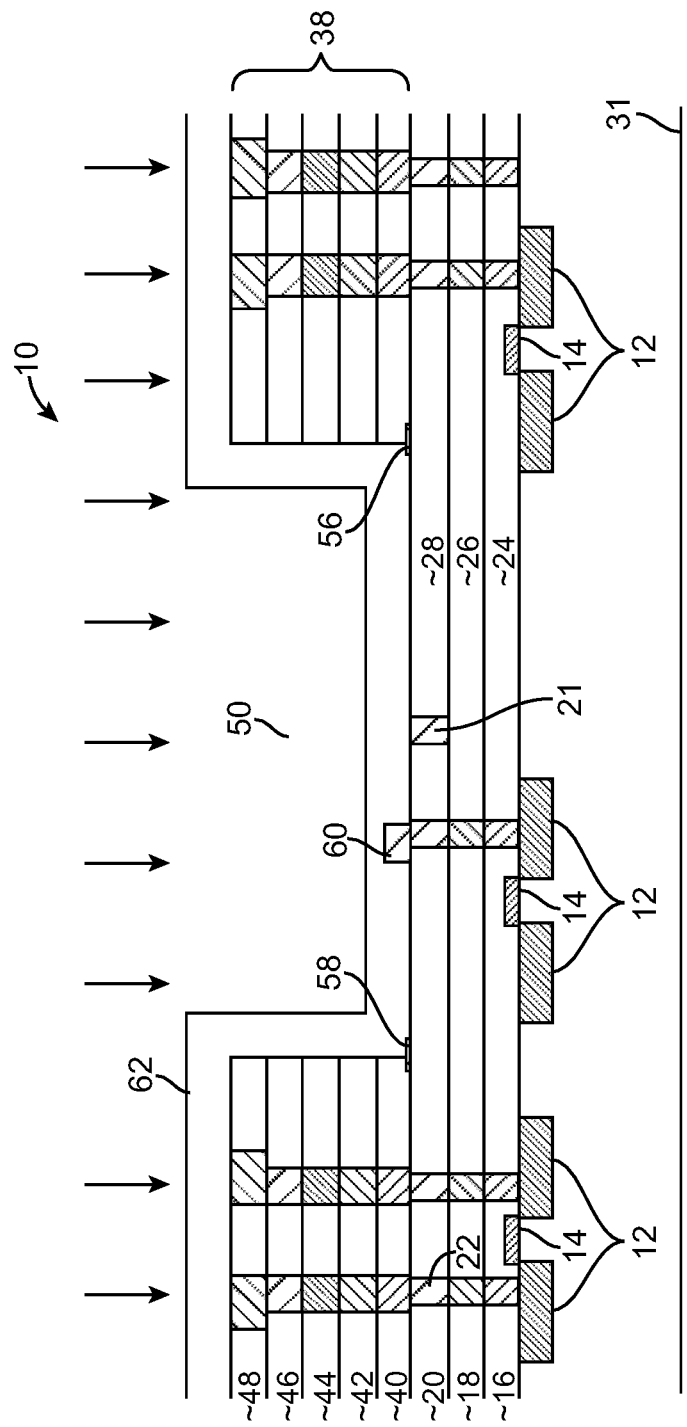
Figure 2G:
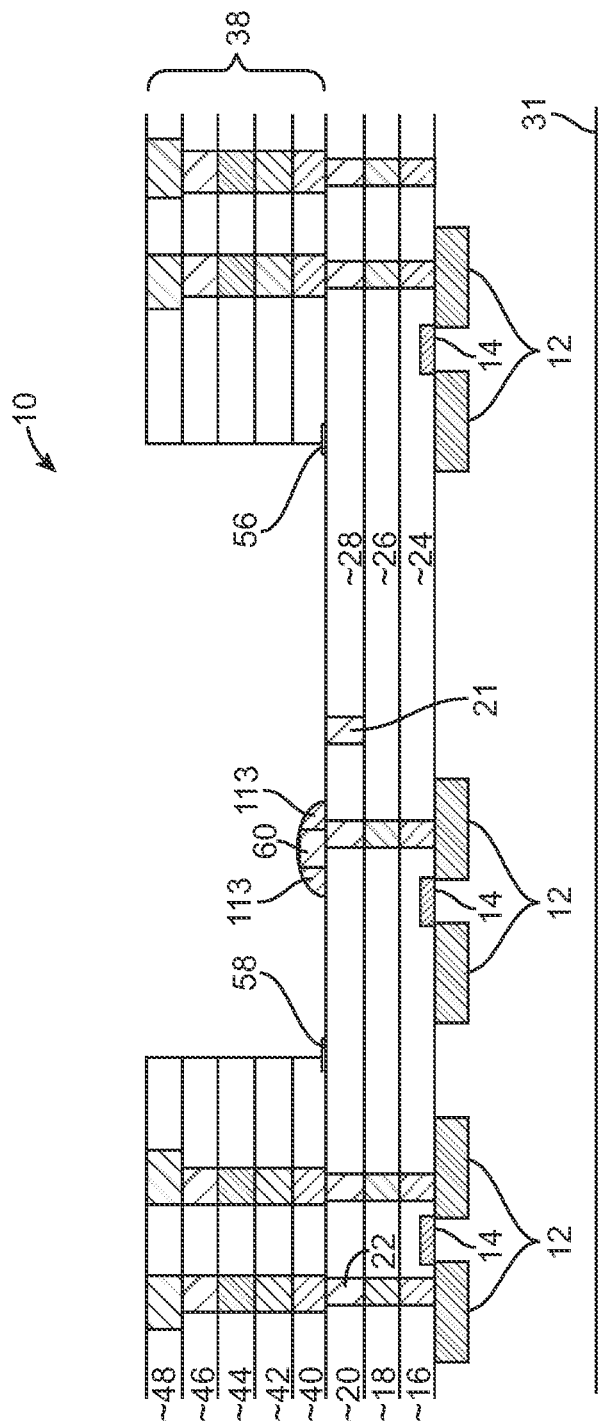
Figure 2H:
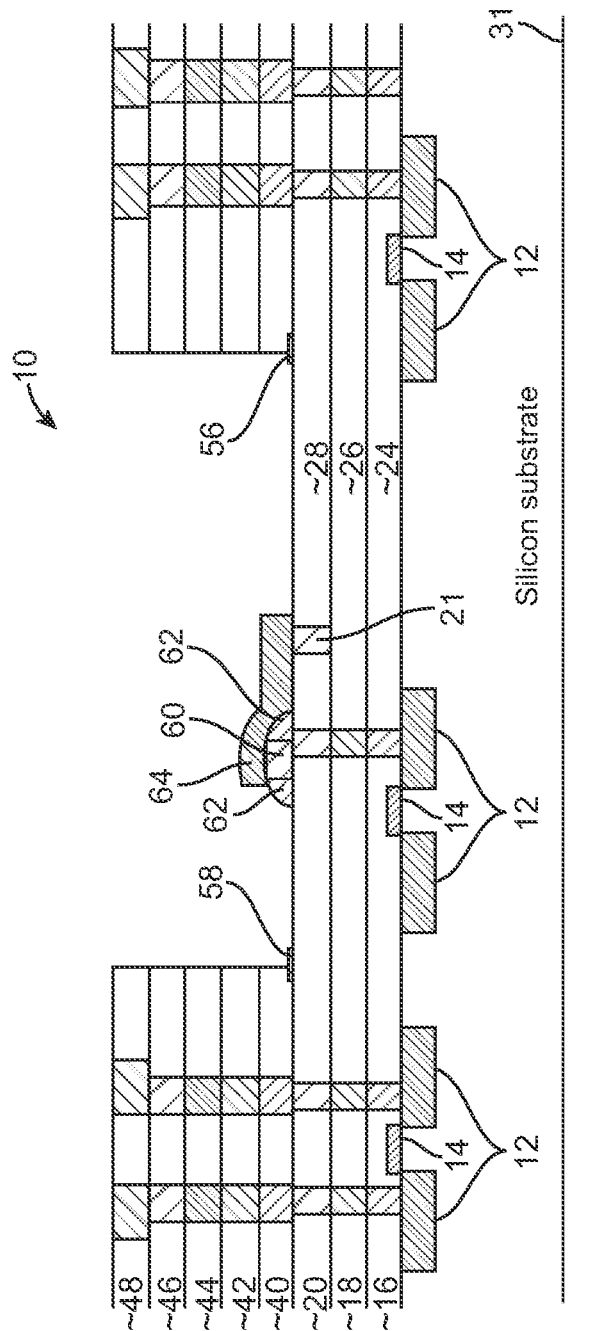

Next, at the step shown in FIG. 2(h), metal 64 is deposited to connect the bit line 21 to the top of the MTJ 60 by extending from the bit line 21 and on top of the ILD layer 28 to and through the top of the MTJ 60. In one embodiment, metal 64 is made of Ta or W or any other metal that can tolerate temperatures around 350-400 degrees Celcuis. In one embodiment, metal 64 has a thickness of approximately 1,500 Angstroms. Metal 64 is a bit line that is now connected to MTJ 60. MTJ 60 is coupled to diffusion region 12, which is the drain of an access transistor coupled to MTJ 60 whose transistor gate is 14 (or 65).

Figure 2I:
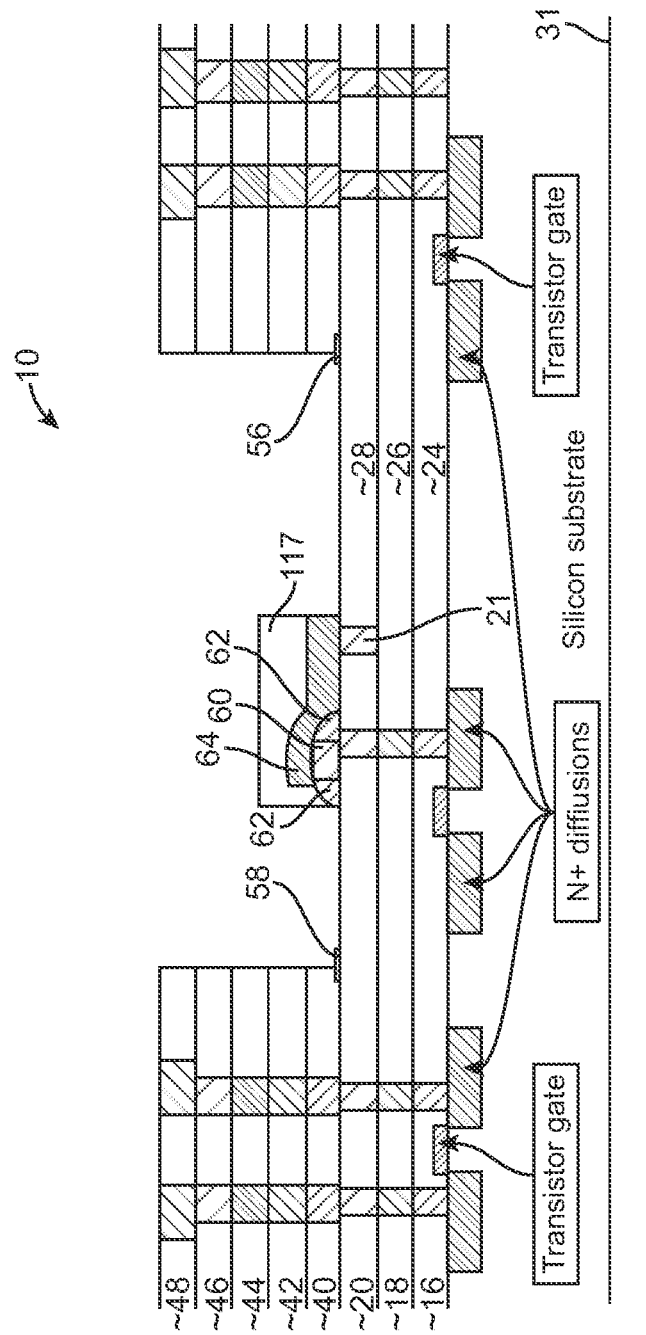
Figure 2J:
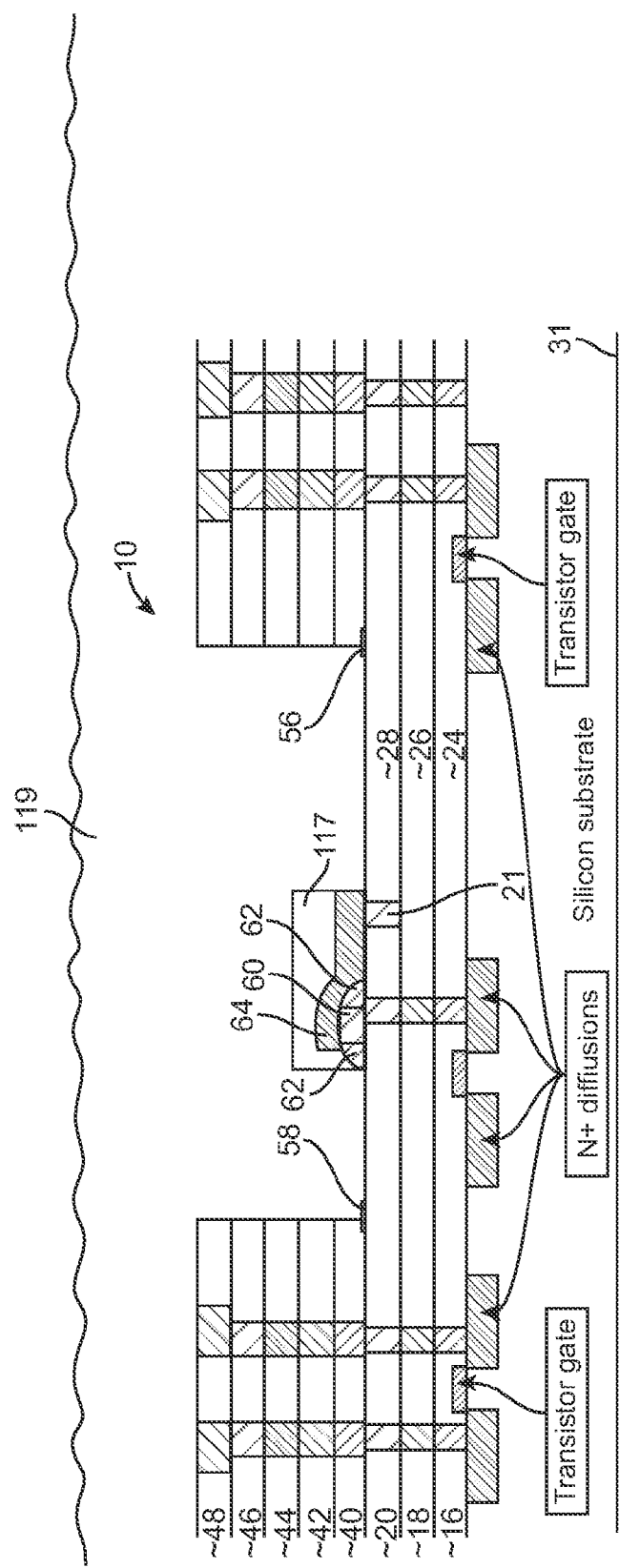
Figure 2K:
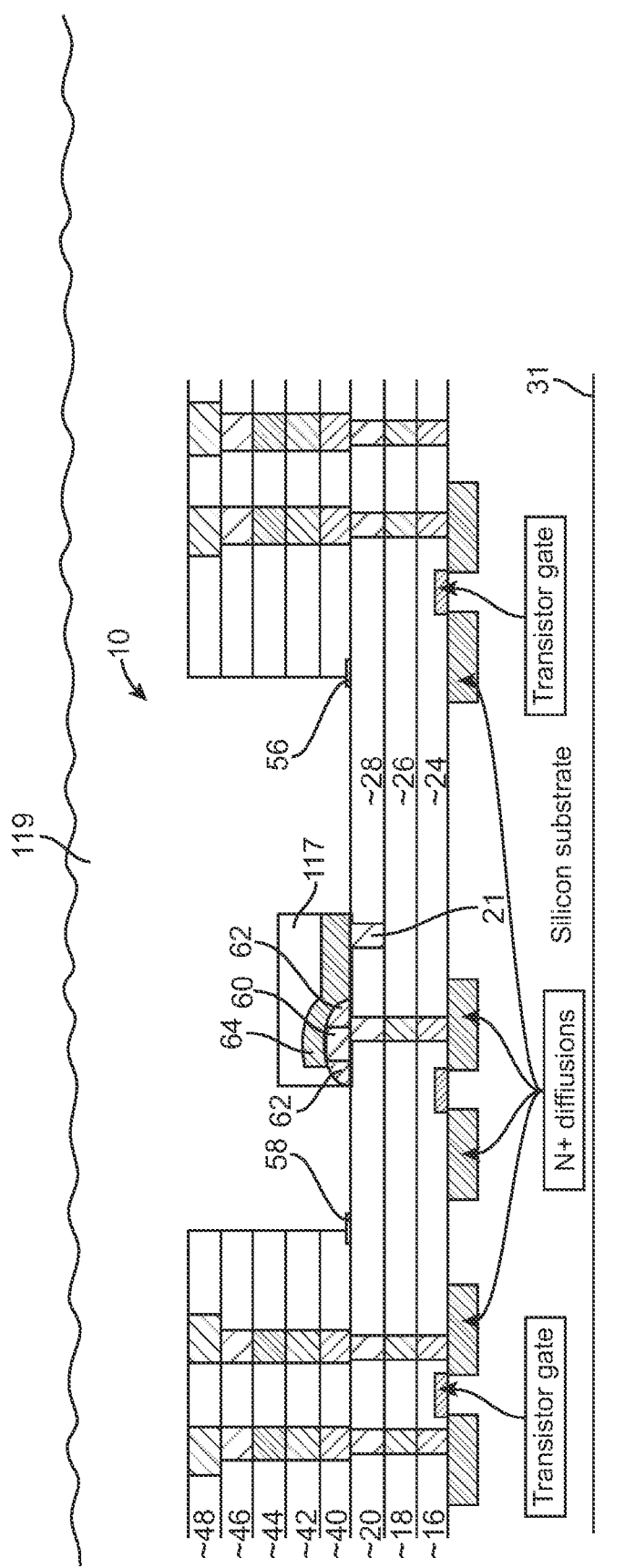

Next, as shown in FIG. 2(i), an interconnect mask 117 is formed on top of metal 64, to define the interconnect. The interconnect mask 117 is removed by etching leaving behind the MTJ untarnished. Next, passivation layers 119 are deposited on top of layers built on top of the substrate 31 up to now, at temperatures at or below 350 degrees Celcuis. Passivation layers 119 are then masked and etched, as shown in FIG. 2(k). The interconnect is subsequently removed.

Figure 3:
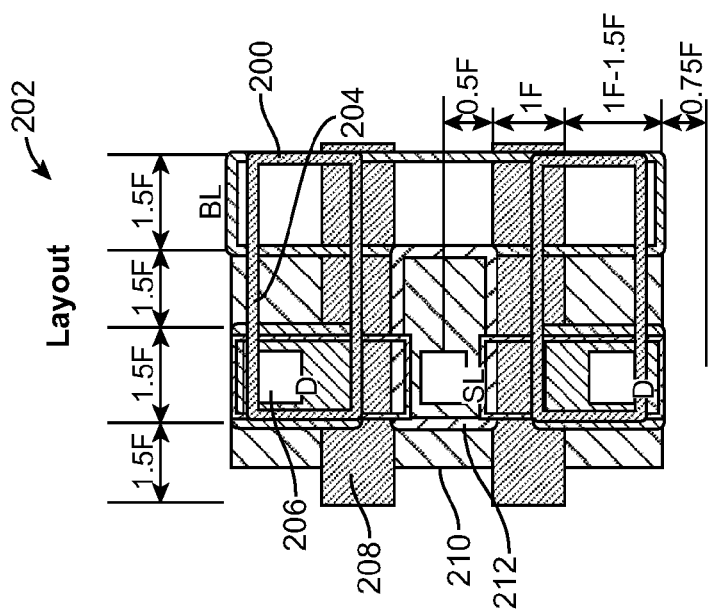

FIG. 3 shows a top view of the layout 202 of a portion of MRAM 100 where an MRAM cell comprising an access transistor and an MTJ is formed, in accordance with an embodiment of the present invention.

In FIG. 3, metal 204 is analogous to metal 64 connecting bit line 200, which is analogous to the bit line 21 of FIG. 2(e), to a corresponding MTJ. This MTJ connects to the drain of the access transistor though contact 206, which is a metal. Gate 208 is the gate of the access transistor and is coupled to the word line (WL 306 in FIG. 4). Source line (SL) 210, which is SL 308 in FIG. 4, serves as the source of the access transistor. Metal 212 is M1 (or M2) is coupled to the source line 210.

The size of the MRAM cell shown in FIG. 3 is effectively 19.5 $F^2$, "F" representing the minimum feature size. This cell size is approximately 3-4 times smaller than current prior art MRAM cell sizes. The minimum cell length of a MRAM cell of an embodiment of the present invention is 0.5+1+1+0.75 or 3.25 F and its minimum cell width is 1.5+1.5+1.5+1.5 or 6 F and its minimum transistor width is 3.5 F. It is understood that this is an exemplary MRAM cell size and that other sizes are contemplated.

Figure 4:
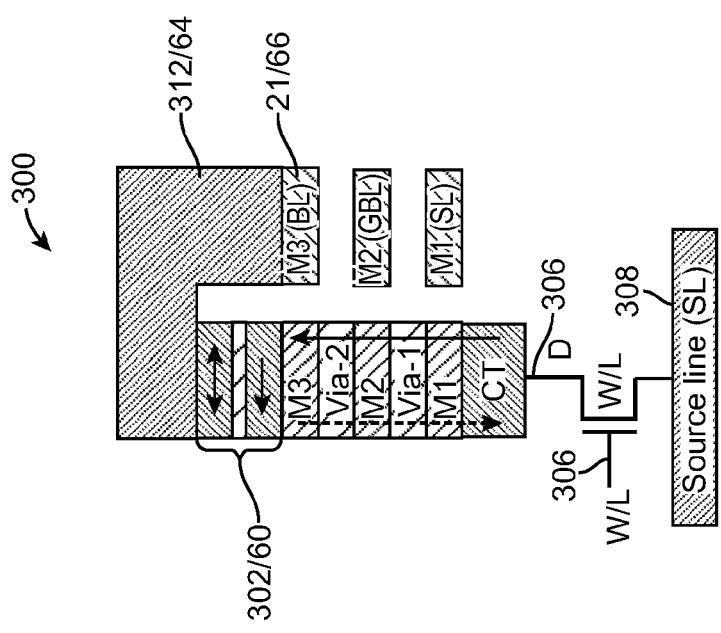

FIG. 4 shows a cross section view of the layout 202. M3, which is the bit line 21 of FIG. 2(e) is shown coupled to MTJ 60 (or 302) through metal 64. MTJ 302 is shown formed on top of three layers, as previously discussed, and coupled to the drain 310 of access transistor 304. The gate of transistor 304 is shown coupled to the word line 306 and the source of the transistor 304 is shown coupled to the source line 308.

Figure 5:
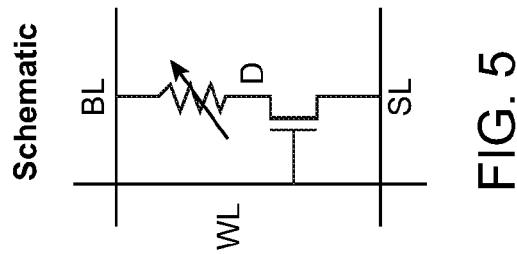
FIG. 5 shows a schematic of a MRAM cell including an MTJ (shown as a variable resistor) and an access transistor.

FIG. 5 shows a schematic of a MRAM cell including an MTJ (shown as a variable resistor) and an access transistor.

Figure 6:
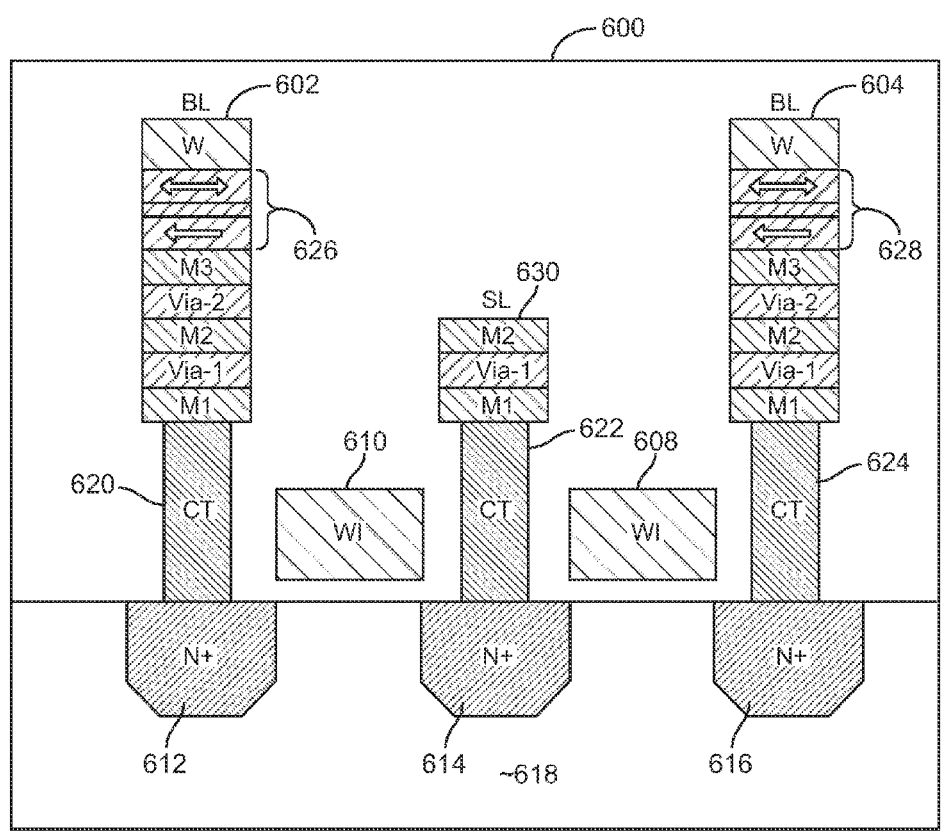
FIG. 6 shows a cross section of a portion of a magnetic memory array comprising two embedded MRAMs, in accordance with an embodiment of the present invention.

FIG. 6 shows a cross section of a portion of a magnetic memory array comprising two embedded MRAMs, in accordance with an embodiment of the present invention. More specifically, in FIG. 6, a magnetic memory array 600 is shown to include a bit line (BL) 602, BL 604, sense line (SL) 630, P substrate 618, N+ diffusion regions 612, 614 and 616, word line (WL) 610 and WL 608 and circuits 620 and 624. The circuits 620 and 624 include non-magnetic circuitry, such as CMOS circuits and comprise the access transistors used to access the embedded MRAMs. That is, an access transistor, included in the circuitry 620, is formed on the N+ diffusion region 612. The N+ diffusion region 612 is formed in the P substrate 618, as are N+ diffusion regions 614 and 616. The access transistor in the circuitry 620 is coupled to an MRAM 626, which is shown formed on top of the circuitry 620 and coupled thereto through the metals and vias M1, M2, M3, Via-1 and Via-2 shown positioned between the circuitry 620 and the MRAM 626. The BL 602 is formed on top of the MRAM 626, as discussed relative to prior embodiments herein. While not shown in FIG. 6 due to the nature of the figure being a cross section view, the WL 610 is coupled to the access transistor in the circuitry 620. Similarly, an access transistor, included in the circuitry 624, is formed on the N+ diffusion region 616. The access transistor in the circuitry 624 is coupled to an MRAM 628, which is shown formed on top of the circuitry 624 and coupled thereto through the metals and vias M1, M2, M3, Via-1 and Via-2 shown positioned between the circuitry 624 and the MRAM 628. The BL 604 is formed on top of the MRAM 628, as discussed relative to prior embodiments herein. While not shown in FIG. 6 due to the nature of the figure being a cross section view, the WL 608 is coupled to the access transistor in the circuitry 624.

An embedded MRAM, as those disclosed in various embodiments of the present invention, allows for fast and non volatile memory, and can be embedded on the same chip next to a microprocessor with much smaller cell size. What makes an MRAM ideal for this application is that the MTJ of the MRAM is fabricated on top of metals, with least interference with the CMOS process. As discussed above, the MTJ elements are added later when the micro processor is completed. In some embodiments of the present invention where spin torque transfer is used, the MTJ resistance changes by spin current induced magnetization switching and uses very little current to do this unlike the field switching technique that requires large amount of currents.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of manufacturing a magnetic random access memory (MRAM) cell comprising:

forming a plurality of diffusion regions and a transistor gate, collectively defining an access transistor, in a silicon substrate;

forming a first metal-interposed-in-interlayer dielectric (ILD) layer having a first metal dispersed therethrough on top of the access transistor, the first metal coupled to one of the plurality of diffusion regions and being in close proximity to a bit line;

forming a first set of plurality of ILD layers on top of the first ILD layer with each layer of the first set of plurality of ILD layers being formed on top of a previous layer of the first set of plurality of ILD layers;

forming a hard-to-etch metal layer on top of a top most one of the first set of plurality of ILD layers;

forming an MRAM area definition mask on a portion of the top of the hard-to-etch metal layer and covering the first metal and the bit line, the MRAM area definition mask defining an MRAM area where MRAM is to be formed;

forming a second set of plurality of ILD layers on top of the first set of plurality of ILD layers with each of the layers of the second set of plurality of ILD layers being formed on top of a previous layer of the second set of plurality of ILD layers;

depositing a photoresist layer on top of the top most layer of the second set of plurality of ILD layers;

etching the photoresist layer to remove a portion of the second set of plurality of ILD layers that are on top of the hard-to-etch metal layer defined as the MRAM area;

etching the hard-to-etch metal layer;

forming a magneto tunnel junction (MTJ) substantially on top of the first set of plurality of ILD layers and on top of the first metal and in the MRAM area;
etching;
depositing a spacer on top of the MTJ;
depositing a second metal on top of the bit line and over a portion of the top most layer of the second set of plurality of ILD layers and extending over the top of the MTJ;
forming an interconnect mask on top of the second metal defining an interconnect;
depositing at least one passivation layer;
masking and etching the at least one passivation layer; and
removing the interconnect to expose the MTJ thereby forming an embedded magnetic random access memory (MRAM).

2. The method of manufacturing a magnetic random access memory (MRAM) cell, as recited in claim 1, wherein the etching step uses reactive ion etching.

3. The method of manufacturing a magnetic random access memory (MRAM) cell, as recited in claim 1, further including forming a nitride layer between the top most layer of the second set of plurality of ILD layers and the hard-to-etch metal layer.

4. The method of manufacturing a magnetic random access memory (MRAM) cell, as recited in claim 1, wherein the spacer is made of silicon nitride.

5. The method of manufacturing a magnetic random access memory (MRAM) cell, as recited in claim 1, wherein the spacer is approximately 1,500 Angstroms in thickness.

6. The method of manufacturing a magnetic random access memory (MRAM) cell, as recited in claim 1, wherein the spacer is made of oxide.

7. The method of manufacturing a magnetic random access memory (MRAM) cell, as recited in claim 1, wherein the MTJ is offset from the first metal.

8. The method of manufacturing a magnetic random access memory (MRAM) cell, as recited in claim 1, wherein more than one embedded MRAM is formed on the silicon substrate.

9. The method of manufacturing a magnetic random access memory (MRAM) cell, as recited in claim 1, wherein the first and plurality of ILD layers are made using a double damascene process.

* * * * *